(12) United States Patent
Lo

(10) Patent No.: US 6,535,390 B1
(45) Date of Patent: Mar. 18, 2003

(54) SECURING DEVICE AND ELECTRONIC APPLIANCE ASSEMBLY APPLYING THE SAME

(75) Inventor: Chung-Chang Lo, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 09/571,714

(22) Filed: May 15, 2000

(30) Foreign Application Priority Data

May 17, 1999 (TW) .................................... 88207883 U

(51) Int. Cl.[7] .............................. G06F 1/16; H05K 7/18
(52) U.S. Cl. ...................... 361/726; 361/685; 361/727; 312/333; 360/157 D
(58) Field of Search ................................ 361/684, 685, 361/724–727, 747, 610; 312/333, 332.1; 360/137, 137 D

(56) References Cited

U.S. PATENT DOCUMENTS

| | | | | | |
|---|---|---|---|---|---|
| 4,982,303 | A | * | 1/1991 | Krenz | 360/137 |
| 5,045,960 | A | * | 9/1991 | Eding | 360/137 |
| 5,359,492 | A | * | 10/1994 | Porter | 361/683 |
| 5,379,184 | A | * | 1/1995 | Barraza et al. | 361/685 |
| 5,557,499 | A | * | 9/1996 | Reiter et al. | 361/685 |
| 5,842,030 | A | * | 11/1998 | Larabell et al. | 395/750.08 |
| 5,877,938 | A | * | 3/1999 | Hobbs et al. | 361/724 |
| 5,978,212 | A | * | 11/1999 | Boulay et al. | 361/685 |
| 6,061,244 | A | * | 5/2000 | O'Sullivan et al. | 361/727 |
| 6,275,377 | B1 | * | 8/2001 | Liu et al. | 361/685 |
| 6,275,382 | B1 | * | 8/2001 | Siedow et al. | 361/727 |
| 6,297,954 | B1 | * | 10/2001 | Seo | 361/686 |
| 6,325,353 | B1 | * | 12/2001 | Jiang | 361/685 |

\* cited by examiner

*Primary Examiner*—Darren Schuberg
*Assistant Examiner*—Lisa Lea-Edmonds
(74) *Attorney, Agent, or Firm*—MacPherson Kwok Chen & Heid LLP

(57) ABSTRACT

An electronic appliance assembly having a frame and at least one electronic device, each of which cooperates with a securing device to be detachably mounted in the frame. The electronic device has a holding medium and the securing device comprises a pressing portion for cooperating with the holding medium of the electronic device to allow the electronic device to be detached from the frame by an external force. The electronic appliance assembly facilitates quick and convenient installation, removal and replacement of the electronic device without needing any screw or tool.

11 Claims, 3 Drawing Sheets

SECURING DEVICE AND ELECTRONIC APPLIANCE ASSEMBLY APPLYING THE SAME

FIELD OF THE INVENTION

The present invention relates to a securing device and an electronic appliance assembly, and more particularly to a securing device mounted between an electronic device and a frame, thereby allowing the electronic device to be installed into and removed from the frame easily and quickly, and an electronic appliance assembly applying the same.

BACKGROUND OF THE INVENTION

Over the past decade, a power supply was so securely fixed to a frame of the computer system that the power supply couldn't be replaced from the frame easily when the power supply was out of order. Now, for continuously supplying power to a general server system, it employs several power supply modules to supply required power thereto. When one of the power supply modules is out of order or needs to be replaced, the power supply module can be removed from the frame and another power supply module may support required power to the server system for maintaining the operation of the server system. Howerver, it is relatively inconvenient for the user to replace the power supply module when one of the power supply modules is out of order or needs to be maintained because he must use some screws and tools to fix the power supply module to the frame.

Please refer to FIG. 1 which is a schematic diagram showing a general fixing way for installing an electronic device into a frame. The frame 11 of the electronic appliance assembly 1 can receive at least one electronic device 12 such as a general power supply or hot swappable power supply module. As shown in FIG. 1, the electronic device 12 has two ear elements. 13 disposed on two opposite side surfaces thereof. When the electronic device 12 is installed into the frame 11, two screws 14 need to be mounted thorough respective tap hole 131 of the ear elements 13 and a corresponding tap hole 15 of the frame 11 to allow the electronic device 12 to be securely fixed to the frame 11. Therefore, it is relatively inconvenient to install the electronic devices 12 into the frame 11. This way obviously slows down the assembling or disassembling speed. Furthermore, the electronic devices 12 are unable to be assembled or disassembled without some screws and tools. It is therefore tried by the applicant to deal with the above situation encountered by the prior art.

SUMMARY OF THE INVENTION

It is therefore an object of the present invention to provide an electronic appliance assembly having a frame and at least one electronic device, each of which cooperates with a securing device to be detachably mounted in the frame. The electronic appliance assembly facilitates quick and convenient installation, removal and replacement of the electronic device without needing any screw or tool.

It is further an object of the present invention to provide a securing device to be mounted between an electronic device and a frame, thereby allowing the electronic device to be installed into and removed from the frame easily and quickly.

According to the preferred embodiment of the present invention, the electronic appliance assembly comprises a frame, an electronic device having a holding medium to be received in the frame, and a securing device mounted between the frame and the electronic device, causing the electronic device to be secured to the frame in a first instance and allowing the electronic device to be detached from the frame in a second instance. The securing device comprises a pressing portion for cooperating with the holding medium of the electronic device to allow the electronic device to be detached from the frame by an external force.

Preferably, the electronic device is a power supply module, and more preferably the electronic device is a hot swappable power supply module.

In accordance with one aspect of the present invention, the securing device further comprises a plate having the pressing portion at one end thereof, and a first engaging element disposed on the plate for engaging with a second engaging element of the frame when the electronic device is installed into the frame.

In accordance with another aspect of the present invention, the plate of the securing device is secured to a side surface of the electronic device at one end thereof opposite to the pressing portion by a screw.

Preferably, the pressing portion of the securing device is arranged adjacent to the holding medium of the electronic device when the securing device is secured to the electronic device.

Preferably, the second engaging element of the frame is a concavity disposed in an inner side surface thereof. Correspondingly, the first engaging element of the securing device is a tongue outwardly projected from the plate of the securing device for detachably engaging with the concavity of the frame.

Preferably, the holding medium is a U-shaped handle disposed on a surface of the electronic device.

Preferably, the securing device is a resilient securing device.

It is still an object of the present invention to provide a securing device to be mounted between an electronic device and a frame, thereby allowing the electronic device to be detachably received in the frame. The securing device comprises a plate adapted to be mounted on a side surface of the electronic device, a first engaging element disposed on the plate for engaging with a second engaging element of the frame, and a pressing portion disposed at one end of the plate for allowing the electronic device to be detached from the frame by an external force.

The present invention may best be understood through the following descriptions with reference to the accompanying drawings, in which:

DETAILED DESCRIPTION OF THE PREFERRED EMBODIMENTS

Figure 1:
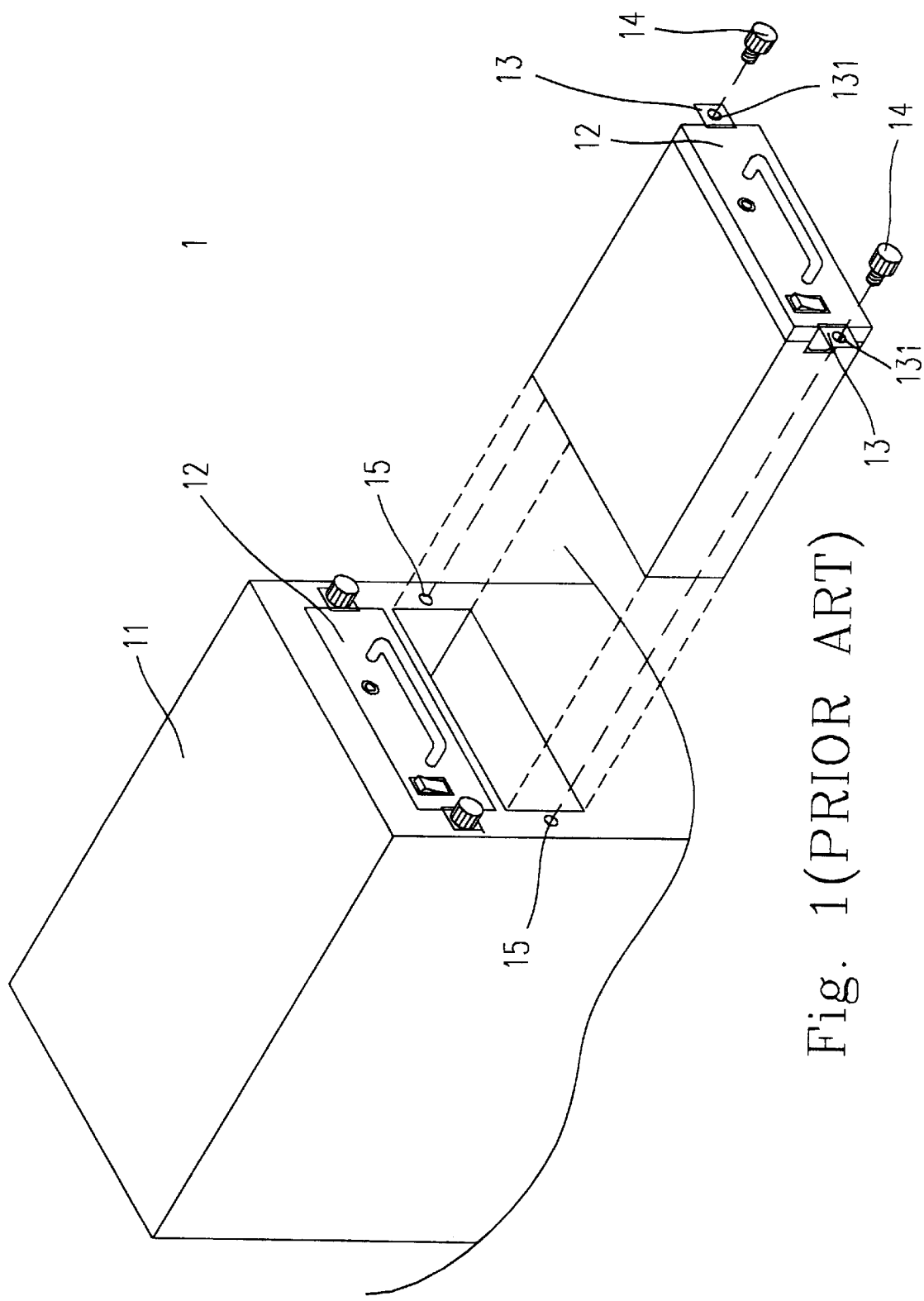
FIG. 1 is a schematic view showing a general assembling way for installing an electronic device into a frame.
Figure 2:
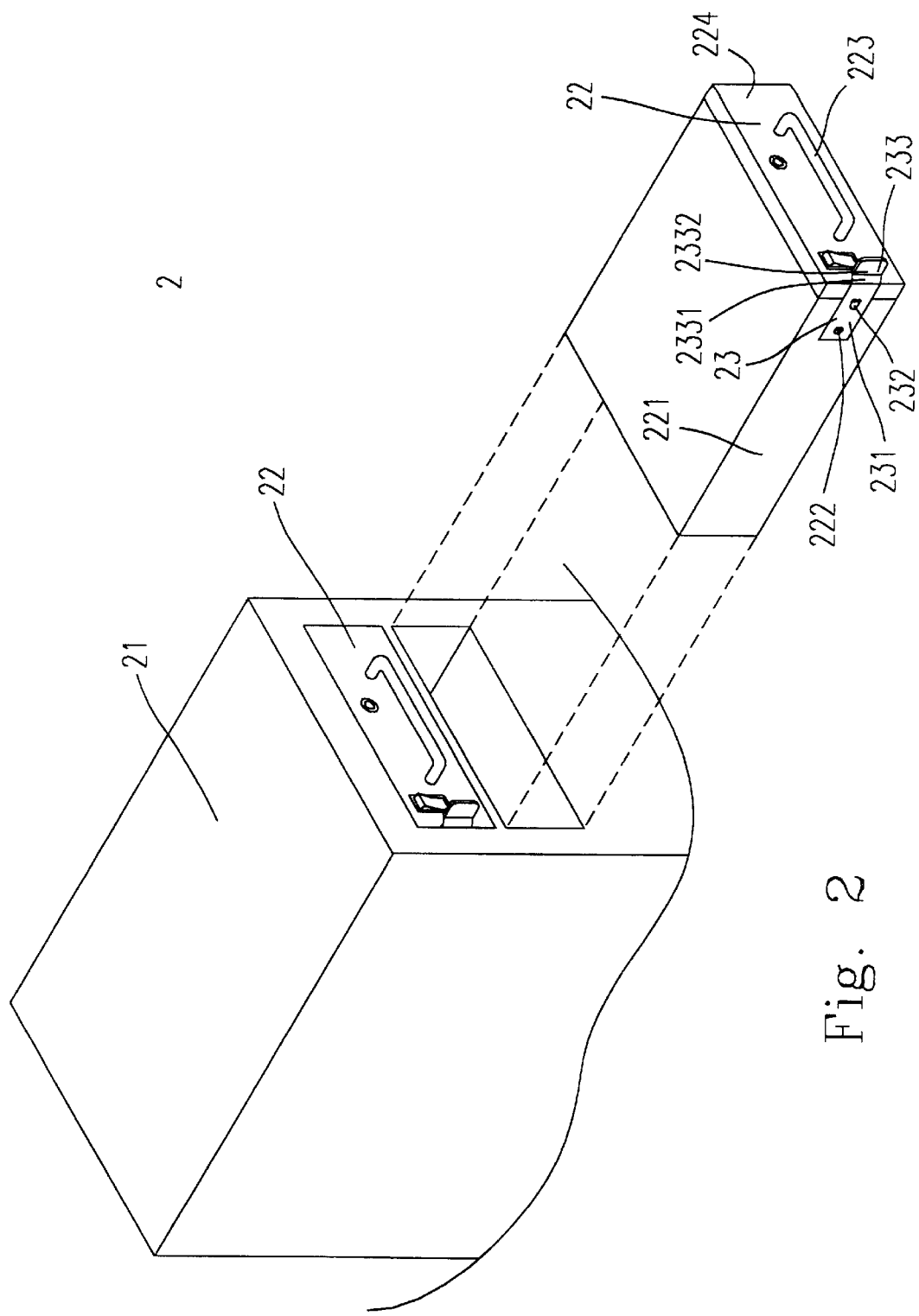
FIG. 2 is a schematical view showing an electronic appliance assembly according to the preferred embodiment of the present invention.
Figure 3:
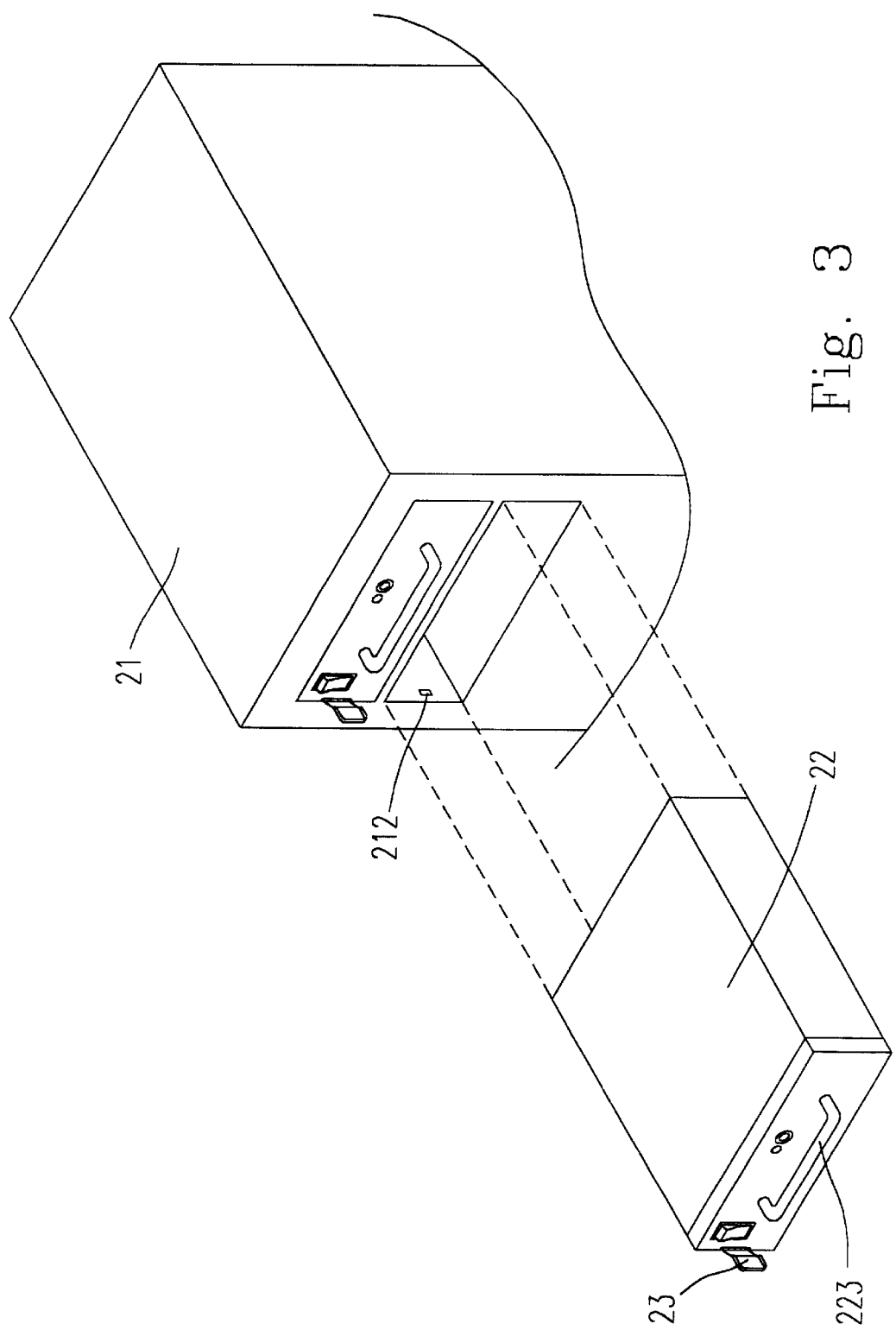
FIG. 3 is a side view of the electronic appliance assembly showing in FIG. 2.

Please refer to FIG. 2 which is a schematical view showing an electronic appliance assembly according to the preferred embodiment of the present invention. The electronic appliance assembly 2 comprises a frame 21 and at least one electronic device 22, each of which cooperates with a securing device 23 to be detachably mounted in the frame 21. Preferably, the electronic appliance assembly 2 is a server system (hardware) and the electronic device is a power supply module. More preferably, the electronic device is a hot swappable power supply module.

The securing device 23 has a resilient plate 231, a tongue 232 outwardly projected from the resilient plate 231, and a pressing portion 233 disposed at one end of the resilient plate 231. Preferably, as shown in FIG. 2, the pressing portion 233 has a connecting end 2331 orthogonal connected to the resilient plate 231 and a free end 2332 parallel to the resilient plate 231. The resilient plate 231 of the securing device 23 is secured to a side surface 221 of the electronic device 22 at one end thereof opposite to the pressing portion 233 by a screw 222 so that the pressing portion 233 is arranged adjacent to a holding medium 223 of the electronic device 22. Certainly, the other portion of the resilient plate 231 is attached to the side surface 221 of the electronic device 22 with a separated gap for allowing the resilient plate 231 to move relative to the electronic device 22 by an external force. Preferably, the holding medium 223 is a U-shaped handle mounted in a surface 224 of the electronic device 22.

When one of the electronic device 22 is installed into the frame 21, the tongue 232 of the securing device 23 engages with a corresponding concavity 212 of the frame 21, thereby causing the electronic device 22 to be securely received in the frame 21. When the user wants to replace one of the electronic devices 22, he can use his thumb pressing the pressing portion 233 of the securing device 23 and other four fingers holding the holding medium 223 of the electronic device 22 to have the tongue 232 of the securing device 23 to be detached from the concavity 212 of the frame 21 by an external force, thereby allowing the electronic device 22 to be removed from the frame easily and quickly. Hence, one may replace the electronic devices 22 of the electronic appliance assembly 2 without any screw and tool.

According to the description with reference to the accompanying drawings, the electronic appliance assembly of the present invention can improve the defects in assembly and disassembly encountered by prior arts. An electronic device such as a hot swappable power supply module can be installed into and removed from the frame more easily and simply without needing any tool or screw.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. An electronic appliance assembly, comprising:
a frame;
an electronic device having a holding medium to be received in said frame; and
a securing device mounted between said frame and said electronic device, causing said electronic device to be secured to said frame in a first instance and allowing said electronic device to be detached from said frame in a second instance, wherein said securing device comprises a plate having a pressing portion at one end thereof, and a first engaging element disposed on said plate for engaging with a second engaging element of said frame when said electronic device is installed into said frame for cooperating with said holding medium of said electronic device to allow said electronic device to be detached from said frame by an external force, wherein said second engaging element of said frame is a concavity disposed on an inner side surface thereof.

2. The electronic appliance assembly according to claim 1, wherein said holding medium is a U-shaped handle disposed on a surface of said electronic device.

3. The electronic appliance assembly according to claim 1, wherein said securing device is a resilient securing device.

4. The electronic appliance assembly according to claim 1, wherein said electronic device is a power supply module.

5. The electronic appliance assembly according to claim 4, wherein said electronic device is a hot swappable power supply module.

6. The electronic appliance assembly according to claim 1, wherein said plate of said securing device is secured to a side surface of said electronic device at one end thereof opposite to said pressing portion by a screw.

7. The electronic appliance assembly according to claim 6, wherein said pressing portion of said securing device is arranged adjacent to said holding medium of said electronic device when said securing device is secured to said electronic device.

8. An electronic appliance assembly, comprising:
a frame;
an electronic device having a holding medium to be received in said frame; and
a securing device mounted between said frame and said electronic device, causing said electronic device to be secured to said frame in a first instance and allowing said electronic device to be detached from said frame in a second instance, wherein said securing device comprises a plate having a pressing portion at one end thereof, and a first engaging element disposed on said plate for engaging with a second engaging element of said frame when said electronic device is installed into said frame for cooperating with said holding medium of said electronic device to allow said electronic device to be detached from said frame by an external force, wherein said second engaging element of said frame is a concavity disposed on an inner side surface thereof, wherein said first engaging element of said securing device is a tongue outwardly projected from said plate of said securing device for detachably engaging with said concavity of said frame.

9. A securing device adapted to be mounted between an electronic device and a frame, thereby allowing said electronic device to be detachably received in said frame, comprising:
a plate adapted to be mounted on a side surface of said electronic device;
a first engaging element disposed on said plate for engaging with a second engaging element of said frame; and
a pressing portion disposed at one end of said plate for allowing said electronic device to be detached from said frame by an external force, wherein said first engaging element is a tongue outwardly projected from said plate for detachably engaging with a concavity of said frame.

10. The securing device according to claim 9, wherein said plate of said securing device is mounted on said side surface of said electronic at one end thereof opposite to said pressing portion by a screw.

11. The securing device according to claim 9, wherein said securing device is a resilient securing device.